(12) United States Patent
Hussa

(10) Patent No.: US 7,498,666 B2
(45) Date of Patent: Mar. 3, 2009

(54) STACKED INTEGRATED CIRCUIT

(75) Inventor: Esa Hussa, Lempäälä (FI)

(73) Assignee: Nokia Corporation, Espoo (FI)

( * ) Notice: Subject to any disclaimer, the term of this patent is extended or adjusted under 35 U.S.C. 154(b) by 582 days.

(21) Appl. No.: 10/950,966

(22) Filed: Sep. 27, 2004

(65) Prior Publication Data

US 2007/0228542 A1 Oct. 4, 2007

(51) Int. Cl.
*H01L 23/02* (2006.01)
*H01L 23/48* (2006.01)

(52) U.S. Cl. .............. 257/686; 257/723; 257/737; 257/E23.141; 257/784

(58) Field of Classification Search .......... 257/686, 257/777, 784, 780, 737, 723, E23.141
See application file for complete search history.

(56) References Cited

U.S. PATENT DOCUMENTS

| | | | | |
|---|---|---|---|---|
| 5,611,876 A | * | 3/1997 | Newton et al. | 156/89.12 |
| 6,008,543 A | * | 12/1999 | Iwabuchi | 257/778 |
| 6,101,100 A | * | 8/2000 | Londa | 361/761 |
| 6,188,127 B1 | * | 2/2001 | Senba et al. | 257/686 |
| 6,380,616 B1 | * | 4/2002 | Tutsch et al. | 257/686 |
| 6,563,212 B2 | * | 5/2003 | Shibamoto et al. | 257/712 |
| 6,809,413 B1 | * | 10/2004 | Peterson et al. | 257/680 |
| 6,982,488 B2 | * | 1/2006 | Shin et al. | 257/777 |
| 2003/0042581 A1 | * | 3/2003 | Fee et al. | 257/666 |
| 2004/0173903 A1 | * | 9/2004 | Yang et al. | 257/738 |

* cited by examiner

*Primary Examiner*—Nitin Parekh
(74) *Attorney, Agent, or Firm*—Ware, Fressola, Van Der Sluys & Adolphson, LLP

(57) ABSTRACT

The invention relates to an integrated circuit comprising a top package with a first substrate carrying an integrated circuit, and a bottom package with a second substrate carrying at least one die. To increase the clearance between the top package and the bottom package, the invention provides a cavity within the lower surface of the top package substrate such that at least parts of the die are placed within the cavity when the top package and the bottom package are assembled into a package stack.

12 Claims, 5 Drawing Sheets

STACKED INTEGRATED CIRCUIT

FIELD OF THE INVENTION

The invention relates in general to an integrated circuit comprising a top package with a first substrate carrying an integrated circuit, and a bottom package with a second substrate carrying at least one die.

The invention also relates in general to a method for assembling an integrated circuit with assembling a top package with a first substrate, and placing an integrated circuit on the first substrate, and assembling a bottom package with a second substrate and placing at least one die.

Further, the invention relates in general to a module comprising an integrated circuit comprising a top package with a first substrate carrying an integrated circuit, and a bottom package with a second substrate carrying at least one die.

The invention relates in general also to an electronic device comprising an integrated circuit with a top package with a first substrate carrying an integrated circuit, and a bottom package with a second substrate carrying at least one die.

BACKGROUND OF THE INVENTION

Today, packing several dies within one package is common knowledge. By packing different dies within one single mold, a package may provide increased functionality. It may also be possible to pack different application specific integrated circuits (ASIC) into one single mold cap to provide different functionality within one chip. However, increasing the number of dies results in increased package size within the stacked die packages. This may be a drawback when applying a stacked die package as bottom package in a package stack, as the clearance between the bottom package substrate and the top package substrate has to be large enough to have the bottom package dies and potential mold caps placed in between the substrates. In other words, the minimum distance between the substrates surfaces is limited by the thickness of the dies and mold cap of the lower package.

Stacked chip scale packages (stacked CSP) with two or more dies stacked within a single package assembly are known. These stacked packages may be organic packages, which are wire bonded and overmolded in a chip scale package profile.

A common approach for assembling stacked packages is to solder the top package, e.g. the substrate of the top package, on top of the bottom package. In particular solder balls at the edges of the substrates are provided. These solder balls allow soldering the top package on top of the bottom package. Typical ball pitch ranges from 0.5 to 0.8 mm for these packages. Also ball grid arrays using full-sized balls with only 0.5 mm maximum height are known. These chips are used in a surface down configuration. The size of the solder balls can also determine the ball pitch, e.g. the distance between the balls.

The typical limiting factor in package stack design can be, as previously pointed out, the clearance between the packages. To provide enough clearance between the packages, the size of the solder balls for soldering the top package on top of the bottom package is chosen to be larger than usual. However, larger solder ball sizes require larger pitch sizes, which again require larger substrate areas. For example, a pitch size of 0.65 mm can be required instead of 0.5 mm to take up all necessary connections between the top and the bottom package. This may increase the package stack size from 12×12 mm to 13×13 mm.

It has also been proposed to provide a hole in the substrate of the top package and to place the die of the top package through the hole on top of the mold cap of the bottom package, insofar as there is no substrate between the bottom mold cap and the top die. Available area for signal traces inside the substrate and available area for connecting elements is reduced, which may further increase package stack size and area requirement on the motherboard.

Other approaches provide placing the stacked dies on the top package. In this case, the lower package only comprises a single overmolded die and the top package comprises the stacked dies. However, the overall height of the stacked package pack is the same as placing the stacked dies within the lower package.

It has also been proposed to provide a hole in the substrate of the top package and to place the die of the top package through the hole on top of the mold of the bottom package, insofar as there is no substrate between the bottom mold and the top die. Available area for signal traces inside the substrate and available area for connecting elements is reduced, which may further increase package stack size and area requirement on the motherboard.

There is a need to reduce both the area and the height taken by packaging of chips. Further size reduction, in particular in terms of chip area, is also necessary. In addition, a further problem is to provide reliable multi-chip solutions even with low motherboard area and component height.

SUMMARY OF THE INVENTION

To overcome these drawbacks, embodiments of the invention provide an integrated circuit comprising a top package with a first substrate carrying an integrated circuit, and a bottom package with a second substrate carrying at least one die, which is characterized by providing a cavity within the lower surface of the top package substrate such that at least parts of the lower package die are placed within the cavity when the top package and the bottom package are assembled into a package stack.

The advantage of the cavity within the lower surface of the top package substrate lies within the increased space for holding the bottom mold cap. The bottom mold cap may require a minimum clearance to the lower surface of the top substrate. This may be required due to tolerance reasons. The cavity may as well provide this tolerance clearance. A mechanical connection between the top substrate and the bottom mold cap is not required.

According to another aspect, a method for assembling an integrated circuit with assembling a top package with a first substrate, and placing an integrated circuit on the first substrate, and assembling a bottom package with a second substrate and placing at least one die on the second substrate, which is characterized by introducing a cavity into the lower surface of the top package substrate, and assembling the top package and the bottom package into a packed package such that at least parts of the die are placed within the cavity is also provided.

Further aspects provide a module comprising an integrated circuit with a top package with a first substrate carrying an integrated circuit, and a bottom package with a second substrate carrying at least one die. The module is characterized by providing a cavity within the lower surface of the top package substrate such that at least parts of the die are placed within the cavity when the top package and the bottom package are assembled into a package stack.

Another aspect of the invention is an electronic device comprising an integrated circuit with a top package with a first substrate carrying an integrated circuit, and a bottom package with a second substrate. This device is characterized by providing a cavity within the lower surface of the top package substrate such that at least parts of the die are placed within the cavity when the top package and the bottom package are assembled into a package stack.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION

Figure 1:
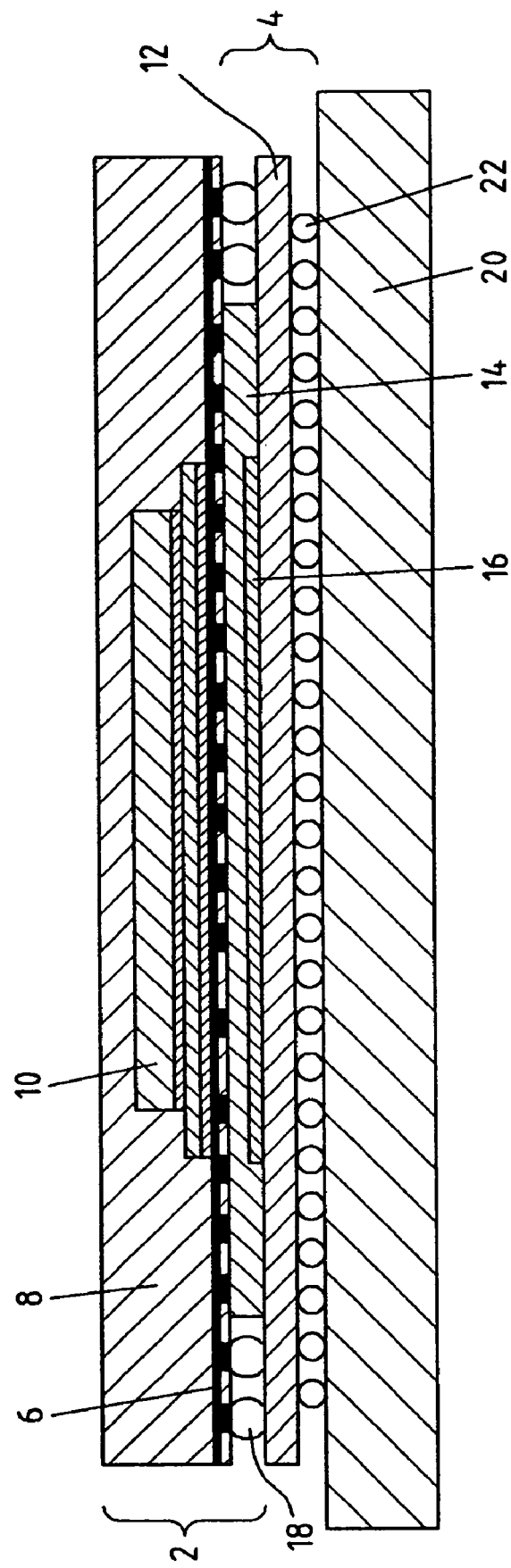
FIG. 1 shows a conventional package stack where the top package has stacked dies.

FIG. 1 shows a package stack with a top module 2 and a bottom module 4. Top module 2 comprises a top substrate 6, a mold cap 8 and stacked dies 10. The mold cap 8 encapsulates the dies 10 on top of the substrate 6. Bottom module 4 comprises a bottom substrate 12, a mold cap 14, and packed dies 16. Mold cap 14 encapsulates the die 16 on top of the substrate 12.

Top module 2 and bottom module 4 are connected through connection elements, for example solder balls 18. The solder balls 18 may be located at areas where the bottom substrate is not covered by the bottom mold cap 14. The dies of top package 10 are connected through lead wires to via connections (not shown) within the top substrate 6 with the solder balls 18. Solder balls 18 are connected with connection traces and via connections (not shown) on bottom substrate 12. The dies of die package 16 are as well connected with connection traces and via connections (not shown) on bottom substrate 12 by lead wires (not shown).

The overall package is connected with a printed wiring board (PWB) 20 through connection elements 22.

It is apparent from FIG. 1 that the clearance between the top substrate 6 and the bottom substrate 12 needs to be big enough to take up the mold cap 14. To provide enough clearance between the substrates, the size of the connection elements 18 needs to be increased. This results in increasing the total package area required, compared to the area required by a bottom package without stacking.

Figure 2:
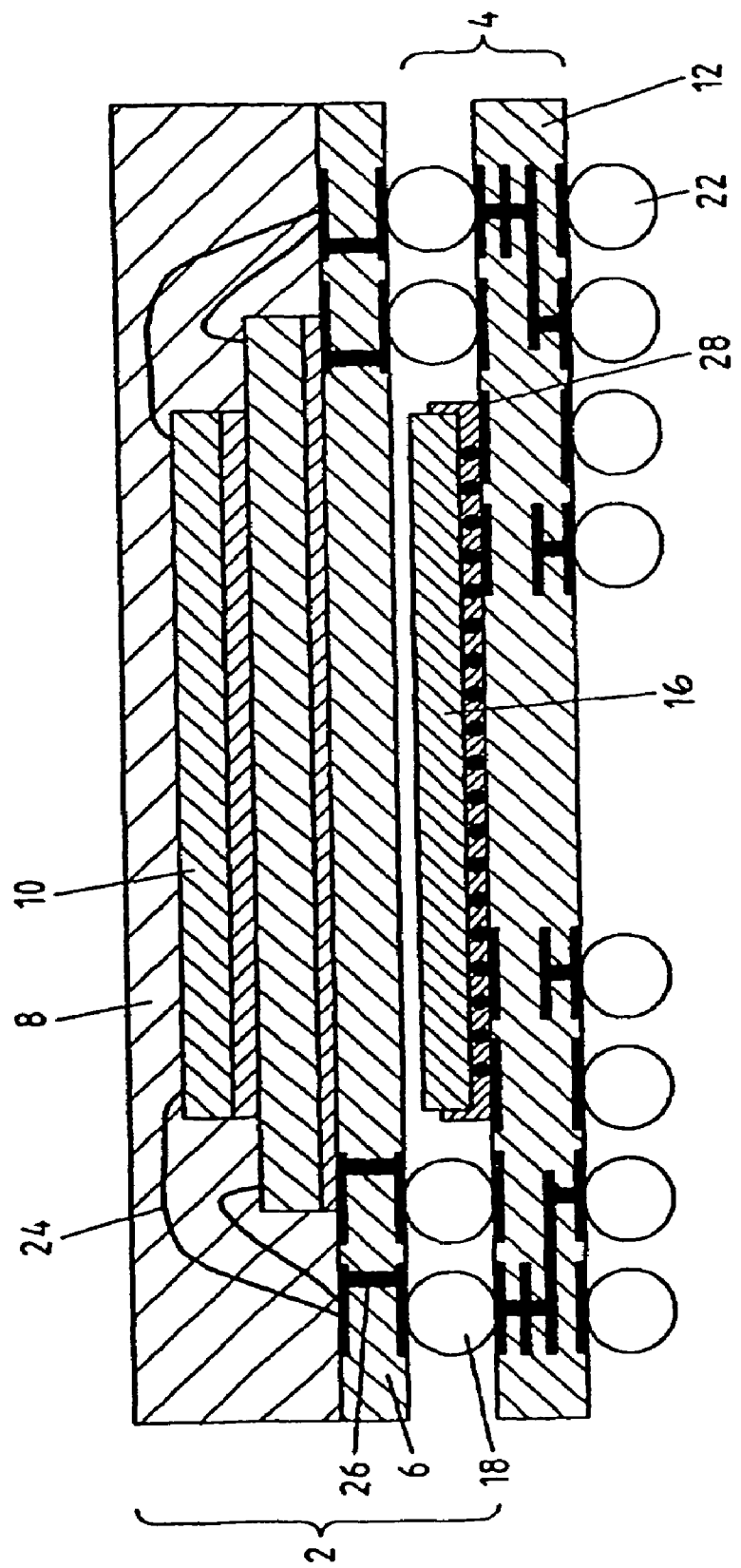
FIG. 2 shows a package stack where a flip chip connection is used in the bottom package to connect the die to the substrate.

FIG. 2 shows a further possible implementation of a package stack. Shown are similar elements as in FIG. 1. In addition, lead wires 24, via connections 26, and connection traces 28 are shown.

The difference to the assembly shown in FIG. 1 lies in the different bottom module 4. The bottom module 4 now has a flip chip connection to connect the die to the substrate and the die is not encapsulated.

Figure 3:
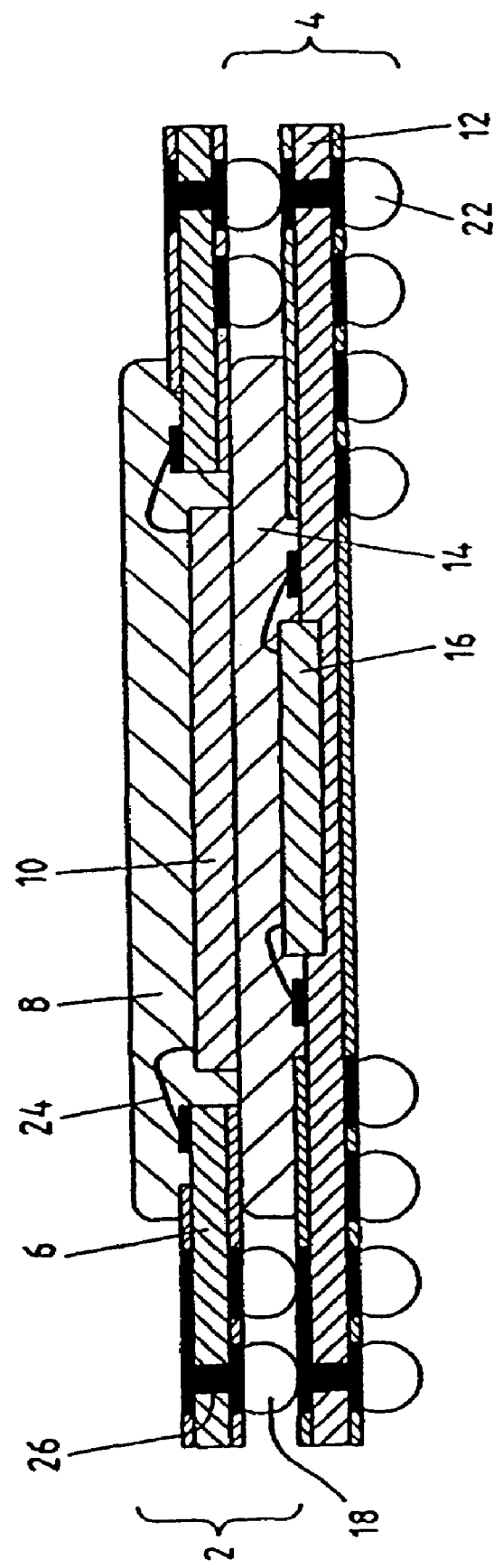
FIG. 3 shows a known package stack with a full cavity in the top substrate and partial cavity in bottom package substrate.

FIG. 3 shows another known solution. Again, similar elements are denoted by similar reference numbers. The embodiment according to FIG. 3 comprises a top module with a die 10 encapsulated within a mold cap 8 and a bottom module with a die 16 encapsulated within a mold cap 14. This embodiment is characterized by a hole within the top substrate 6. This hole allows placing the die 10 within the top package substrate which reduces top package height. In the lower package substrate there is a partial cavity, where the die is placed, which enables smaller distance between lower and upper package.

Figure 4:
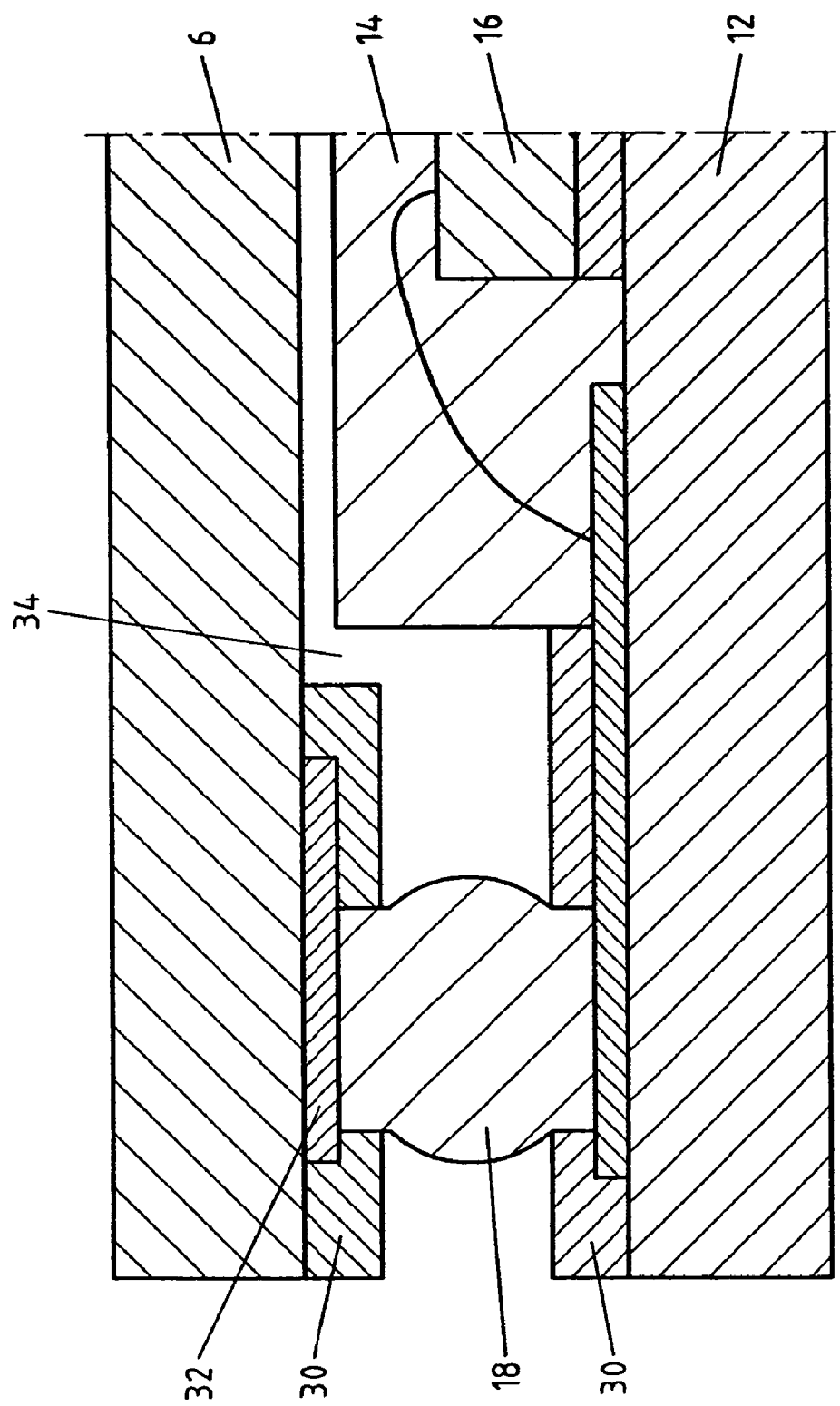
FIG. 4 shows a package stack according to implementations with a cavity in the solder mask of the lower surface of the top package substrate.

FIG. 4 shows an exemplary embodiment of the invention. Shown are similar elements as within the previous figures. Additionally shown are solder mask 30, copper pads 32 and cavity 34. According to this embodiment, the upper substrate is built from the upper substrate core material 6, the copper pads 32 and the solder mask 30. To allow providing a bigger clearance between the upper and lower package and/or to allow smaller connection elements, a cavity 34 is provided in the solder mask 30. In case no copper traces are required in the area of the cavity on the lower surface of the upper substrate 6, this cavity may be provided within the solder mask 30. The mold cap 14 may be placed in this cavity. The clearance between the upper surface of the mold cap 14 and the lower surface of the substrate 6 of the cavity 34 allows tolerances in the height of the mold cap 16.

On the top package at least one die and at least one mold cap overmolding the die on the top substrate 6 may be provided according to embodiments, increasing functionality of the assembly.

As depicted, embodiments provide connecting the top package with the bottom package through connection elements 18 arranged between the first substrate and the second substrate. These may be solder balls or bond pads or any other connection elements.

As the clearance between the top substrate 6 and the bottom substrate 12 is increased, the size of the connection elements 18 may be smaller than without a cavity. The smaller connection elements allow smaller pitch sizes, thereby providing that the required connections between the top module and the bottom module may be provided within a smaller area than with connection elements of usual size. Other embodiments may provide dummy joints between the first and the second substrate providing increased connection reliability. The dummy joints, e.g. connection elements not providing any electrical connectivity between the top module and the bottom module, may increase the connection strength and thus improve mechanical properties of the assembly.

The connection balls may be provided at areas, where the mold cap of the bottom module does not cover the substrate of the bottom module and where the cavity is arranged. The connection elements may be solder balls or lead pads or any other elements capable of electrically connecting elements. The connecting elements may, for instance, be arranged on the outer edges of the package. Connections between the packages and the connection elements may be provided by via connecting wires, running through the substrate.

Figure 5:
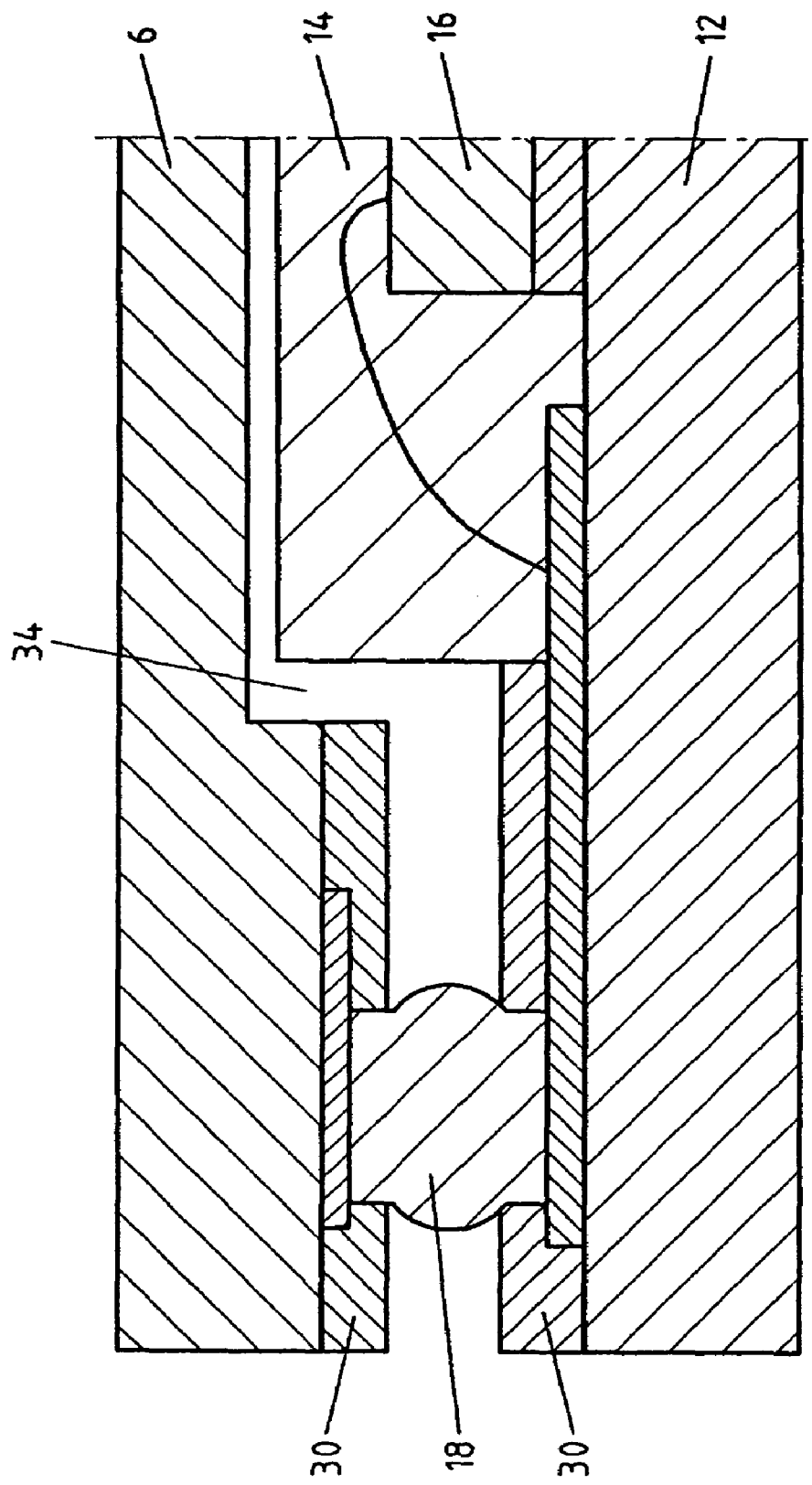
FIG. 5 shows a package stack according to implementations with a cavity in the substrate material of the lower surface of the top package substrate.

FIG. 5 depicts a further embodiment of the invention. The elements shown in FIG. 5 are similar to these in FIG. 4. The cavity 34 is provided within the material of the top substrate 6 itself. This cavity 34 may be deeper than the cavity shown in FIG. 4. The cavity may even extend through the top package substrate thus forming a hole to the substrate. It may provide larger mold caps 14 within the clearance between the top substrate 6 and the bottom substrate 12. The cavity 34 may be etched from the substrate 6 during etching the copper traces on the lower surface of substrate 6.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An integrated circuit comprising
a top package with a first substrate for carrying an integrated circuit, and
a bottom package with a second substrate for carrying at least one die, wherein the top package is configured to provide a cavity within the lower surface of the first substrate such that at least parts of the at least one die are placed within the cavity when the top package and the bottom package are assembled into a package stack, and wherein the first and second substrates are each comprised of a solid material having no openings extending therethrough.

2. The integrated circuit of claim 1, configured to provide a mold cap encapsulating the at least one die within the bottom package and placing at least parts of the mold cap within the cavity.

3. The integrated circuit of claim 1, configured to provide the cavity within a solder mask of the bottom surface of the top package substrate.

4. The integrated circuit of claim 1, configured to provide the cavity within the substrate material of the top package substrate.

5. The integrated circuit of claim 1, configured to provide at least one die and one mold cap encapsulating the die on the upper surface of the top substrate.

6. The integrated circuit of claim 1, configured to connect the top package with the bottom package through connection elements arranged between the first substrate and the second substrate.

7. The integrated circuit of claim 1, configured to provide solder balls as connection elements.

8. The integrated circuit of claim 1, configured to provide dummy joints between the first and the second substrate providing increased connection reliability.

9. A module comprising:
an integrated circuit comprising
a top package with a first substrate for carrying an integrated circuit, and
a bottom package with a second substrate for carrying at least one die,
wherein the top package is configured to provide a cavity within the lower surface of the first substrate such that at least parts of the at least one die are placed within the cavity when the top package and the bottom package are assembled into a package stack, and wherein the first and second substrates are each comprised of a solid material having no openings extending therethrough.

10. An electronic device comprising:
an integrated circuit comprising
a top package with a first substrate for carrying an integrated circuit, and
a bottom package with a second substrate for carrying at least one die,
wherein the top package is configured to provide a cavity within the lower surface of the first substrate such that at least parts of the at least one die are placed within the cavity when the top package and the bottom package are assembled into a package stack, and wherein the first and second substrates are each comprised of a solid material having no openings extending therethrough.

11. An integrated circuit comprising
a top package having means for carrying an integrated circuit, and
a bottom package having means for carrying at least one die,
wherein the top package is configured to provide a cavity within the lower surface of the means for carrying an integrated circuit such that at least parts of the at least one die are placed within the cavity when the top package and the bottom package are assembled into a package stack, and wherein the means for carrying an integrated circuit and means for carrying at least one die are each comprised of a solid material having no openings extending therethrough.

12. The integrated circuit of claim 11, configured to provide a mold cap encapsulating the at least one die within the bottom package and placing at least parts of the mold cap within the cavity.

* * * * *